(12) United States Patent
Ma

(10) Patent No.: US 7,179,109 B1
(45) Date of Patent: Feb. 20, 2007

(54) LAND GRID ARRAY CONNECTOR WITH REINFORCEMENT STIFFENER

(75) Inventor: Hao-Yun Ma, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/515,582

(22) Filed: Sep. 5, 2006

(30) Foreign Application Priority Data

Sep. 5, 2005  (TW) .............................. 94215182 U

(51) Int. Cl.
*H01R 13/62* (2006.01)

(52) U.S. Cl. ..................................................... 439/331

(58) Field of Classification Search ................ 439/331, 439/73, 342, 135, 41, 940
See application file for complete search history.

(56) References Cited

U.S. PATENT DOCUMENTS 6,971,902 B2* 12/2005 Taylor et al. ............... 439/342

* cited by examiner

*Primary Examiner*—Tho D. Ta
(74) *Attorney, Agent, or Firm*—Wei Te Chung

(57) ABSTRACT

An LGA connector (1) comprises a housing (11) for receiving a number of contacts (12), a stiffener (13) partly covering and reinforcing the housing. The stiffener comprises a pair of lateral sides (130), a front end (131) defining a chamber (136) with a U-shaped cross-section and a rear end (132), and a central cavity (133) disposed therebetween. The front end defines a pair of openings (135) at two opposite ends thereof to make the plating liquor enter into the chamber uniformly.

10 Claims, 4 Drawing Sheets

(The Related Art)

LAND GRID ARRAY CONNECTOR WITH REINFORCEMENT STIFFENER

BACKGROUND OF THE INVENTION

1. Field of the Invention

The present invention relates to an electrical connector, and more particularly to a land grid array (LGA) connector for electrically connecting an electronic package such as an LGA chip and a circuit substrate such as a printed circuit board (PCB).

2. Description of the Prior Art

Land grid array (LGA) electrical connectors are widely used in the connector industry for electrically connecting LGA chips to printed circuit boards (PCBs) in personal computers (PCs). Conventionally, one kind of the LGA connector mainly comprises an insulative housing, a multiplicity of contacts received therein, a metallic stiffener partly covering and reinforcing the housing, and a metal clip and a cam lever pivotably mounting on two opposite sides of the stiffener. The housing defines a multiplicity of terminal passageways in a rectangular array, for interferentially receiving corresponding terminals. Due to the very high density of the terminal array that an LGA chip may have, the LGA chip needs to be precisely seated on the LGA connector. This is to ensure reliable signal transmission between the terminals and the LGA chip.

Referring to FIG. 4, such a conventional LGA connector 8 typically comprises an insulative housing 80, a plurality of electrical contacts 81 received in corresponding passageways (not labeled) of the housing 80, a metal stiffener 82 partly covering and reinforcing the housing 80, a cam lever 84 pivotably received in a chamber 820 with a U-shaped cross-section of the stiffener 82, and a metal clip 83 pivotably mounted to an opposite rear end 821 with an L-shaped cross-section of the stiffener 82 for engaging with the cam lever 84. The housing 80 defines four sidewalls (not labeled) and a central cavity disposed between the sidewalls. The central cavity is used for receiving a land grid array (LGA) chip (not shown) therein. Each contact 81 has a contact portion protruding outwardly from an upper surface of the housing 80, for electrically connecting with a corresponding metal contact pad of the LGA chip that is received in the LGA connector 8, and a solder portion mounted on a printed circuit board (PCB) (not shown) via a surface mounted solder ball (not shown). The clip 83 comprises two opposite sides 830. A pair of pressing portions 831 is provided in respective middle portions of the sides 830, for pressing the LGA chip engaging with the terminals 81.

When the LGA connector 8 is electrically connected the LGA chip, firstly, engaging the LGA chip with the LGA connector 8, the clip 83 is rotated upward. The LGA chip is placed in the central cavity of the housing 80. The clip 83 is rotated from a vertical portion to a horizontal portion to make the two opposite sides 830 of the clip 83 attach on corresponding sides of the LGA chip. The cam lever 84 is rotated to drive the clip 83 to gradually approach the housing 80 until the pressing portions 831 of the clip 83 press the LGA chip downwardly to make the contact pads of the LGA chip contact with the contact portions of the terminals 81 and make the LGA chip received in the central cavity therein. As a result, mechanical and electrical engagement between the LGA chip and the LGA connector 8 is attained.

However, the stiffener 82 is integrately formed as a single piece metal by stamping and passed through a plating process to increase its wearable performance. Because the front end 820 of the stiffener 82 has a U-shaped cross-section chamber (not labeled). In a plating process, the plating solute is not easy to fill in the whole chamber of the stiffener 82 to result in the chamber of the stiffener 82 plating asymmetrically. When this happens, reliable wearable performance of the stiffener 82 will be destroyed. The LGA connector 8 may not reliably electrically connect with the LGA chip.

Thus, there is a need to provide a new LGA connector that overcomes the above-mentioned problems.

SUMMARY OF THE INVENTION

Accordingly, an object of the present invention is to provide a land grid array (LGA) connector which has a reinforcement stiffener, wherein the stiffener is configured to provide securely and reliably wearable performance during a plating process by providing openings to convenient for electrodepositing.

To fulfill the above-mentioned object, an LGA connector in accordance with a preferred embodiment of the present invention comprises an insulative housing, a plurality contacts received therein, a metallic stiffener partly covering and reinforcing the housing, and a metal clip and a lever pivotally mounted on opposite ends of the housing. The housing defines a generally rectangular cavity for receiving an electronic package such as an LGA central processing unit (CPU) therein. A multiplicity of passageways is defined in a portion of the housing around the cavity, for receiving a corresponding number of the contacts therein. The stiffener comprises a pair of lateral sides each having an L-shaped cross-section, a front end defining a chamber with a U-shaped cross-section, and a rear end having an L-shaped cross-section. The front end defines a pair of openings at two opposite ends thereof. Thus it is convenient for the plating solute to fill in the chamber of the stiffener uniformly during in plating process.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
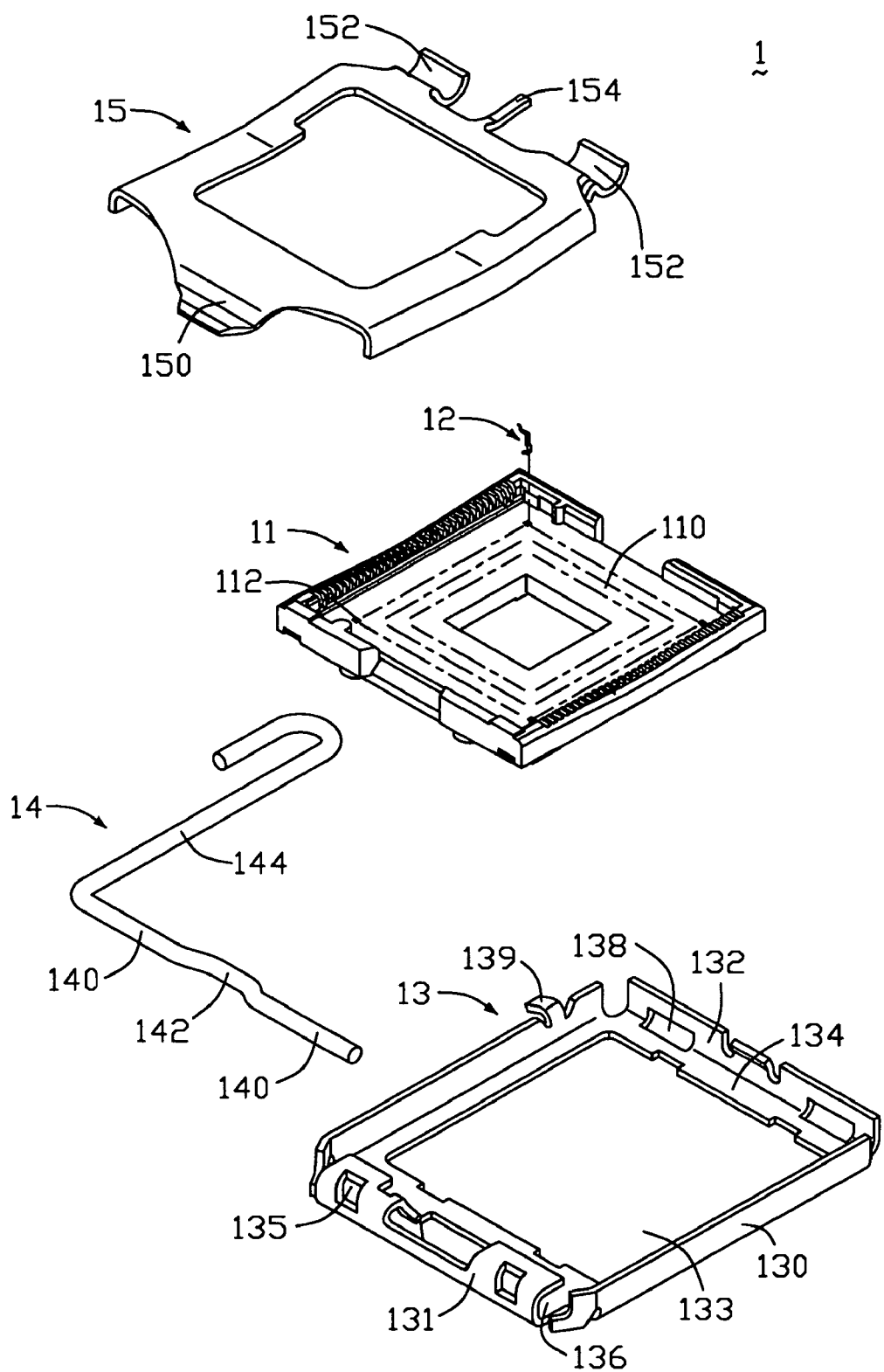
FIG. 1 is an exploded, isometric view of an LGA connector in accordance with a preferred embodiment of the present invention.

FIG. 1 is an exploded, isometric view of a land grid array (LGA) connector 1 in accordance with the preferred embodiment of the present invention. The LGA connector 1 is provided for electrically connecting an electronic package, such as an LGA chip (not shown) and a circuit substrate, such as a printed circuit board (PCB) (not shown). The LGA connector 1 comprises a generally rectangular insulative housing 11, a multiplicity of contacts 12 received in the housing 11, a metal stiffener 13 partly covering, surrounding and reinforcing the housing 11, a lever 14 pivotably received in an end of the stiffener 13, and a metal clip 15 pivotably mounted to an opposite end of the stiffener 13 for engaging with the lever 14.

The housing 11 defines a generally rectangular cavity 110 in a middle thereof. The cavity 110 is used for receiving the LGA chip therein. A multiplicity of passageways 112 is defined in a portion of the housing 11 under the cavity 110, the passageways 112 receiving a corresponding number of the contacts 12 therein respectively. Each contact 12 has a contacting portion (not labeled) protruding outwardly from a top face of the cavity 110 of the housing 11, for resiliently electrically contacting a corresponding pad of the LGA chip, and a solder portion mounted on the PCB via a first surface mounted solder ball (not shown).

The stiffener 13 is integrately formed as a single piece metal by stamping and comprises a pair of lateral sides 130 each having an L-shaped cross-section, a front end 131 having a U-shaped cross-section, and a rear end 132 having an L-shaped cross-section, and a central cavity 133 disposed therebetween. The housing 11 is fittingly received in the central cavity 133 of the stiffener 13. The sides 130, the front end 131 and the rear end 132 each define a bottom wall 134 thereof, thereby around the central cavity 133. A pair of openings 135 is formed on a periphery side of the front end 131. An elongate chamber 136 is defined in the front end 131 of the stiffener 13 and communicated with the opening 135. A pair of spaced slots 138 is defined in the rear end 132 of the stiffener 13. An ear 139 extends arcuately from an edge of one of the lateral sides 130 of the stiffener 13.

The lever 14 comprises a pair of locating portions 140 pivotably received in the chamber 136 of the stiffener 13, an offset actuating portion 142 between the locating portions 140, and an operating portion 144 extending perpendicularly from an end of one of the locating portions 140. The operating portion 144 is disposed outside of the stiffener 13. When oriented at a horizontal position parallel to the housing 11, the operating portion 144 engages with the ear 139.

The clip 15 defines a generally rectangular window (not labeled) in the middle thereof. The clip 15 comprises an engaging portion 150 extending arcuately from an end thereof, a pair of spaced securing portions 152 extending arcuately from an opposite end thereof and pivotably received in the slots 138 of the stiffener 13, and a tail 154 between the securing portions 152. When the clip 15 is oriented at a horizontal position parallel to the housing 11, the engaging portion 150 of the clip 15 is engaged with the actuating portion 142 of the lever 14, and the clip 15 thereby presses the LGA chip onto the contacts 12. When the clip 15 is oriented at a position perpendicular to the housing 11, the tail 154 abuts against the stiffener 13 to prevent the clip 15 from being over-rotated.

Figure 2:
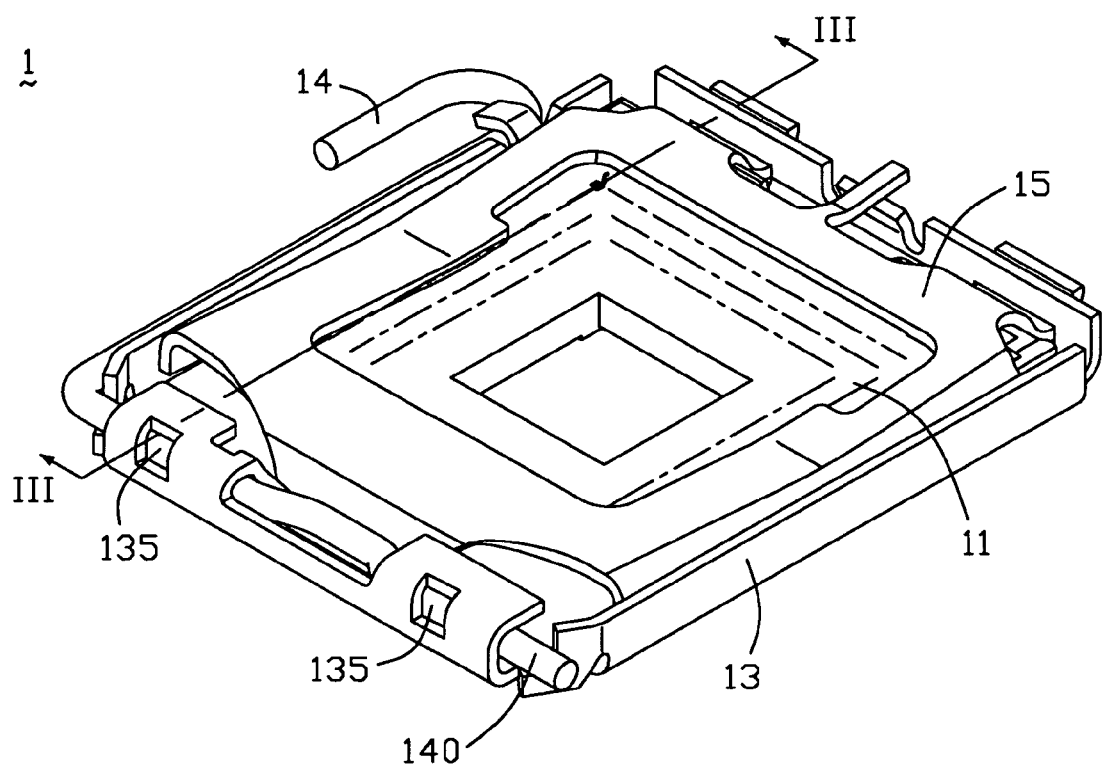
FIG. 2 is an assembly view of FIG. 1.
Figure 3:
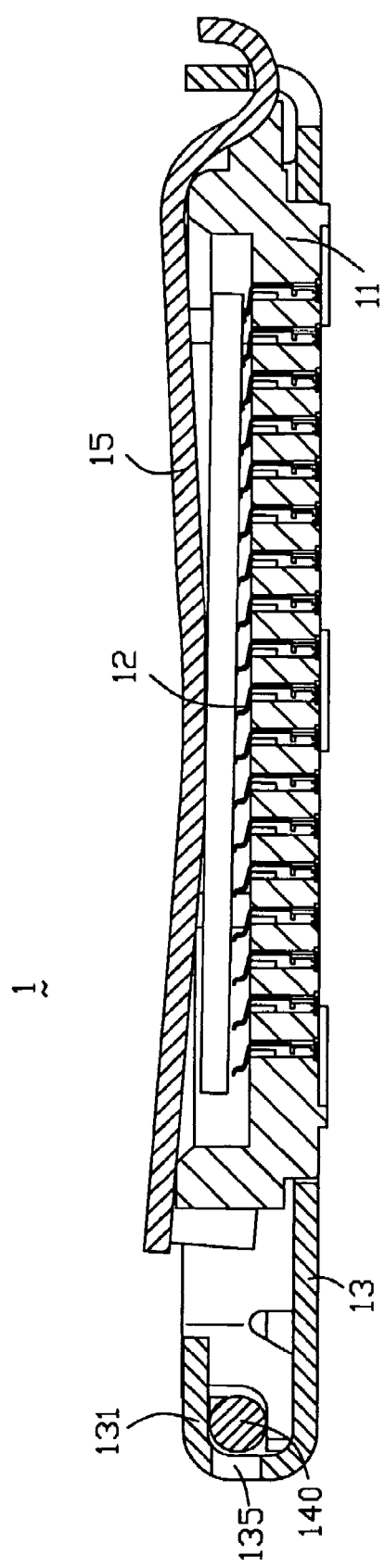
FIG. 3 is a cross-sectional view taken along line III—III of FIG. 2.
Figure 4:
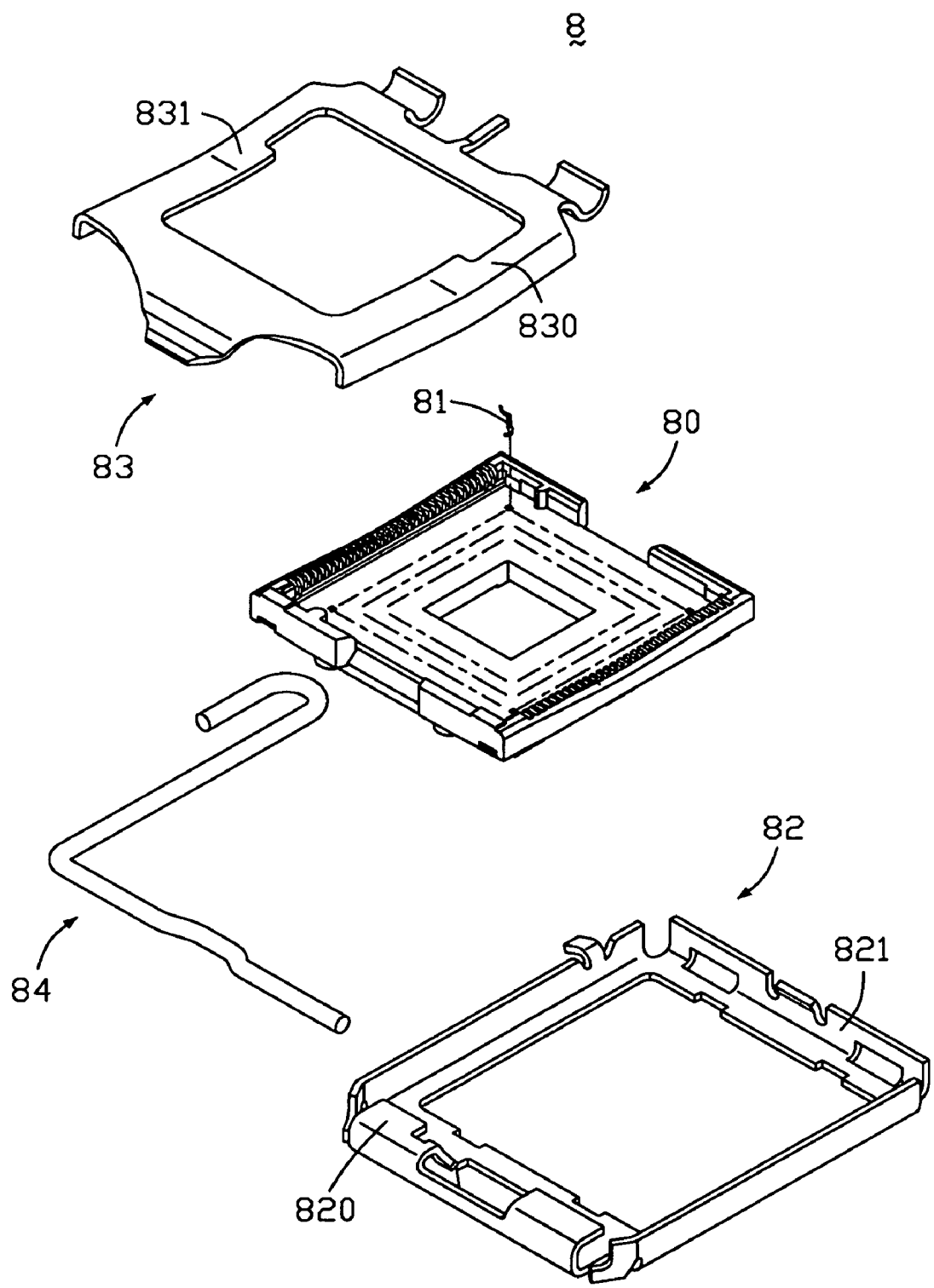
FIG. 4 is an exploded, isometric view of a conventional LGA connector.

Referring to FIGS. 1–3, when the LGA connector 1 engages with the LGA chip, firstly, the clip 15 is oriented at the vertical, the LGA chip is positioned in the cavity 110 of the housing 11 to make the leads of the LGA chip contact the corresponding terminals 12 in the housing 11. The clip 15 is rotated from the vertical position to a horizontal position, thereby the clip 15 touches on the LGA chip. The lever 14 is rotated until the actuating portion 142 touches and presses on the engaging portion 150 of the clip 15, the operating portion 144 of the lever 14 being locked in the ear 139 of the stiffener 13 in the end for locking the clip 15. The clip 15 is pressed by the lever 14 and impacted the LGA chip so that the leads of the LGA chip touches on the terminals 12 received in the housing 11. The force of the clip 15 operating on the LGA chip can maintain a reliable electrical connection between the contacts pads on the LGA chip and respective terminals 12 in the housing 11.

In addition, rigidity of the housing 11 is improved with the stiffener 13 made of rigid material being equipped on the housing 11. So the two opposite end of the housing 11 will not slope when the clip 15 presses the housing 11 on the center of the housing 11. The force that the housing 11 operates on the clip 15 and the lever 14 will not decrease. The force that the clip 15 operates on the LGA chip will not decrease at same time, so that the steady electrical connection between the leads on the LGA chip and the corresponding terminals 12 in the housing 11 will be ensured.

Although the stiffener 13 is integrately formed as a single piece metal by stamping, it has enough wearable performance via plating process. During the stiffener 13 in plating process, the plating liquor can enter into the front end 131 with a U-shaped cross-section configuration via the openings 135 and plate the chamber 136 uniformly, thereby providing reliable wearable performance for the stiffener 13.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A land grid array (LGA) connector for electrically connecting an electronic package and a printed circuit board (PCB), comprising:

an insulative housing defining a substantially rectangular cavity in a middle thereof, the cavity being adapted for receiving the electronic package therein;

a plurality of electrical contacts received in the housing;

a metal clip disposed on the housing to press the electronic package upon the contacts; and a metallic stiffener partly covering, surrounding and reinforcing the housing, the stiffener comprising a pair of lateral sides each having an L-shaped cross-section, a front end having a U-shaped cross-section, and a rear end having an L-shaped cross-section, a plurality of openings formed on the front end and an elongate chamber defined in the front end and communicated with the opening, said openings for making a plating solute to fill in the chamber uniformly during the stiffener in plating process; wherein the connector further comprises a lever pivotably received in said front end of the stiffener.

2. The LGA connector as claimed in claim 1, wherein said openings are arranged around a periphery area of said chamber.

3. The LGA connector as claimed in claim 2, wherein a pair of spaced slots is defined in the rear end of the stiffener.

4. The LGA connector as claimed in claim 3, wherein an ear extends arcuately from an edge of one of the lateral sides of the stiffener.

5. The LGA connector as claimed in claim 4, wherein a pair of spaced securing portions is extending arcuately from an opposite end thereof and pivotably received in the slots of the stiffener, and a tail formed between the securing portions.

6. The LGA connector as claimed in claim 5, wherein a pair of locating portions is pivotably received in the chamber of the stiffener, an offset actuating portion formed between the locating portions, and an operating portion extends perpendicularly from an end of one of the locating portions.

7. An electrical connector comprising:

an insulative housing defining an upward receiving cavity;

a plurality of contacts disposed in the housing and communicating with the receiving cavity;

a metallic stiffener retainably surrounding the housing and defining opposite first and second ends;

a lever rotatably disposed at the first end; and a clip rotatably disposed at the second end; wherein the first end defines at least one U-shaped configuration to hold the lever in position under a condition that an opening is formed in said first end so as to communicate an exterior with a chamber defined in said U-shaped configuration, said opening for making a plating solute to fill in the chamber uniformly during the stiffener in plating process.

8. The connector as claimed in claim 7, wherein said first end defines two of said at least one U-shaped configuration with a cutout therebetween so as to allow an engaging portion of the clip to be received therein.

9. The connector as claimed in claim 7, wherein said opening defines a circumference fully surrounded by the first end.

10. The connector as claimed in claim 9, wherein said opening communicates the exterior with the chamber along a front-to-back direction defined by said first and second ends.

* * * * *